US008288758B2

(12) United States Patent
Ning et al.

(10) Patent No.: US 8,288,758 B2
(45) Date of Patent: Oct. 16, 2012

(54) SOI SIGE-BASE LATERAL BIPOLAR JUNCTION TRANSISTOR

(75) Inventors: Tak H. Ning, Yorktown Heights, NY (US); Kevin K. Chan, Staten Island, NY (US); Marwan H. Khater, Astoria, NY (US)

(73) Assignee: International Business Machines Corporation, Armonk, NY (US)

( * ) Notice: Subject to any disclaimer, the term of this patent is extended or adjusted under 35 U.S.C. 154(b) by 98 days.

(21) Appl. No.: 12/958,647

(22) Filed: Dec. 2, 2010

(65) Prior Publication Data

US 2012/0139009 A1 Jun. 7, 2012

(51) Int. Cl.
*H01L 29/06* (2006.01)
*H01L 31/109* (2006.01)
*H01L 31/0328* (2006.01)
*H01L 31/117* (2006.01)

(52) U.S. Cl. .......................... 257/19; 257/200; 257/616
(58) Field of Classification Search .................... 257/19, 257/200, 616
See application file for complete search history.

(56) References Cited

U.S. PATENT DOCUMENTS

| 5,298,786 | A | 3/1994 | Shahidi et al. | |
| 6,982,474 | B2 * | 1/2006 | Currie et al. | 257/616 |
| 7,465,664 | B2 * | 12/2008 | Ho et al. | 438/682 |
| 7,473,947 | B2 * | 1/2009 | Murthy et al. | 257/288 |
| 7,518,196 | B2 * | 4/2009 | Chau et al. | 257/401 |
| 8,035,098 | B1 * | 10/2011 | Chen et al. | 257/19 |
| 2002/0093053 | A1 * | 7/2002 | Chan et al. | 257/347 |
| 2004/0119102 | A1 * | 6/2004 | Chan et al. | 257/270 |

OTHER PUBLICATIONS

Strum, J.C. et al., "A Lateral Silicon-on-Insulator Bipolar Transistor with a Self-Aligned Base Contact" IEEE Electron Device Letters (1987) vol. EDL-8, No. 3.
Rodder, M. et al., "Silicon-on-Insulator Bipolar Transistors" IEEE Electron Device Letters (1983) vol. EDL-4, No. 6.

* cited by examiner

*Primary Examiner* — Luan C Thai
(74) *Attorney, Agent, or Firm* — Scully, Scott, Murphy & Presser, P.C.; H. Daniel Schnurmann

(57) ABSTRACT

A lateral heterojunction bipolar transistor (HBT) is formed on a semiconductor-on-insulator substrate. The HBT includes a base including a doped silicon-germanium alloy base region, an emitter including doped silicon and laterally contacting the base, and a collector including doped silicon and laterally contacting the base. Because the collector current is channeled through the doped silicon-germanium base region, the HBT can accommodate a greater current density than a comparable bipolar transistor employing a silicon channel. The base may also include an upper silicon base region and/or a lower silicon base region. In this case, the collector current is concentrated in the doped silicon-germanium base region, thereby minimizing noise introduced to carrier scattering at the periphery of the base. Further, parasitic capacitance is minimized because the emitter-base junction area is the same as the collector-base junction area.

13 Claims, 14 Drawing Sheets

SOI SIGE-BASE LATERAL BIPOLAR JUNCTION TRANSISTOR

BACKGROUND

The present disclosure relates to a lateral bipolar transistor (BJT) structure, and particularly to a lateral bipolar junction transistor including a SiGe base and located on an semiconductor-on-insulator (SOI) substrate and methods of manufacturing the same.

The parasitic capacitance between the extrinsic base, the emitter, and/or the collector is a performance-limiting factor for a bipolar junction transistor. The parasitic capacitance reduces the switching speed of the bipolar junction transistor. The noise generated at the periphery of the base is another performance-limiting factor for a bipolar junction transistor. Typically, charge carriers can be temporarily captured at an interface between the base and a surrounding dielectric material, and emitted at a subsequent time to introduce electrical noise in the signal. In order to provide signal amplification with high fidelity, such noise must be suppressed to a minimum level. Yet another performance-limiting factor for a bipolar junction transistor is the maximum current density that the transistor can handle without speed degradation. Further, practical issues of manufacturability, i.e., lower processing cost, short processing time, and high process yield, must be addressed in order to provide a high-performance bipolar junction transistor that can be commercially manufactured.

While many types of bipolar junction transistors have been proposed in the prior art, most fail to simultaneously address the above issues, let alone providing a satisfactory solution addressing them.

BRIEF SUMMARY

A lateral heterojunction bipolar transistor (HBT) is formed on a semiconductor-on-insulator substrate. The HBT includes a base including a doped silicon-germanium alloy base region, an emitter including doped silicon and laterally contacting the base, and a collector including doped silicon and laterally contacting the base. Because the collector current is channeled through the doped silicon-germanium base region having a band gap less than silicon, the HBT can accommodate a greater current density at a given emitter-base forward bias voltage than a comparable bipolar transistor employing a silicon base region. The base may also include an upper silicon base region and/or a lower silicon base region. In this case, the collector current is concentrated in the doped silicon-germanium base region, thereby minimizing noise introduced to carrier scattering at the periphery of the base. Further, parasitic capacitance is minimized because the emitter-base junction area is the same as the collector-base junction area.

According to an aspect of the present disclosure, a semiconductor structure is provided, which includes: a base including at least a silicon-germanium alloy base region having a doping of a first conductivity type; an emitter including a first doped silicon region having a doping of a second conductivity type that is the opposite of the first conductivity type, wherein a first lateral heterojunction is present at a first interface between the first doped silicon region and the silicon-germanium alloy region; a collector including a second doped silicon region having a doping of the second conductivity type, wherein a second lateral heterojunction is present at a second interface between the second doped silicon region and the silicon-germanium alloy region; and an extrinsic base contacting a top surface of the base and including a semiconductor material having a doping of the first conductivity type.

According to another aspect of the present disclosure, a method of forming a semiconductor structure is provided, which includes: providing a semiconductor material structure including at least a silicon-germanium alloy layer on a substrate, wherein the silicon-germanium alloy layer has a doping of a first conductivity type; forming an extrinsic base directly on a top surface of a portion of the semiconductor material structure by depositing and patterning a semiconductor material having a doping of the first conductivity type; forming a first trench by removing a first portion of the semiconductor material structure from one side of the extrinsic base and forming a second trench by removing a second portion of the semiconductor material structure from an opposite side of the extrinsic base; and forming an emitter in the first trench and a collector in the second trench by selectively depositing silicon epitaxially, wherein the emitter and the collector have a doping of a second conductivity type that is the opposite of the first conductivity type.

DETAILED DESCRIPTION

Figure 1:
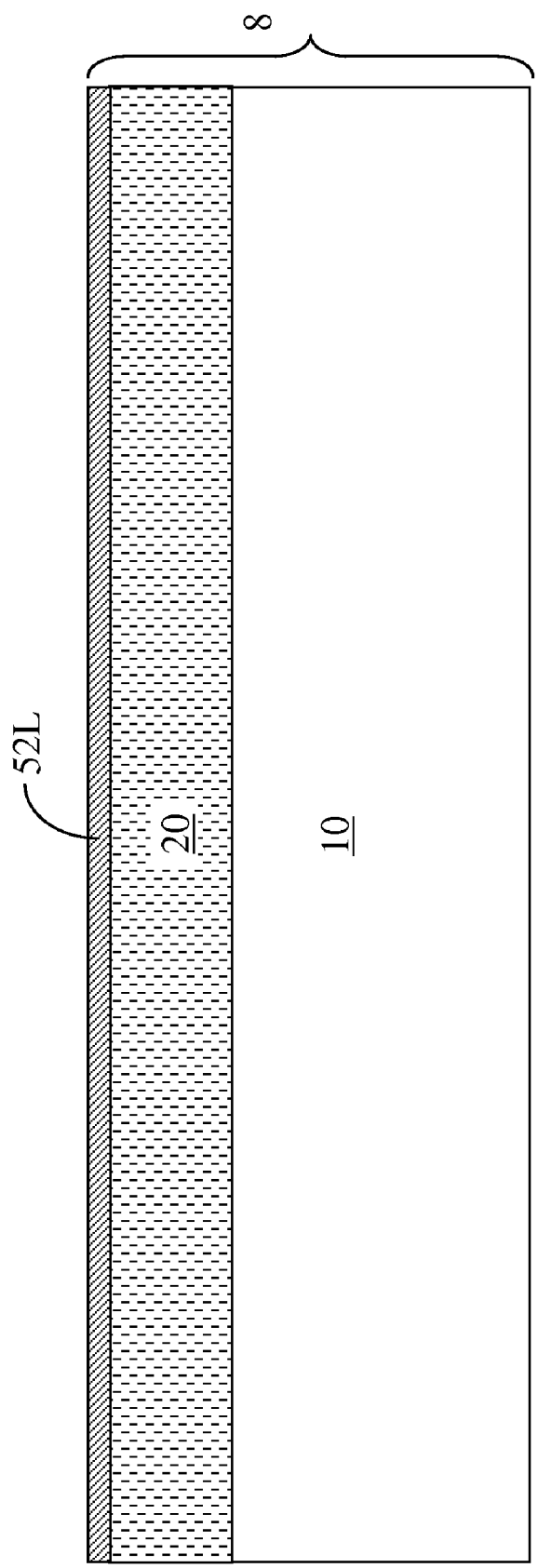
FIG. 1 is a vertical cross-sectional view of a first exemplary semiconductor structure including a semiconductor-on-insulator (SOI) substrate as provided according to a first embodiment of the present disclosure.

As stated above, the present disclosure relates to a lateral bipolar junction transistor including a SiGe base and located on an semiconductor-on-insulator (SOI) substrate and methods of manufacturing the same, which are now described in detail with accompanying figures. It is noted that like and corresponding elements mentioned herein and illustrated in the drawings are referred to by like reference numerals.

Referring to FIG. 1, a first exemplary semiconductor structure according to a first embodiment of the present disclosure includes a substrate 8 including at least a dielectric material layer and a silicon layer located on a top surface of the dielectric material layer. The substrate 8 can be, for example, a semiconductor-on-insulator (SOI) substrate, which includes a handle substrate 10, a buried insulator layer 20 contacting a top surface of the handle substrate 10, and a silicon layer contacting a top surface of the buried insulator layer 20. This silicon layer is herein referred to as a lower silicon layer 52L because another silicon layer can be subsequently formed over the lower silicon layer 52L.

The handle substrate 10 can include a semiconductor material, an insulator material, a conductor material, or a combination thereof. In one example, the handle substrate 10 can include a semiconductor material such as silicon. If the handle substrate 10 includes a semiconductor material, the handle substrate 10 can be undoped or have a p-type doping or an n-type doping.

The buried insulator layer 20 includes a dielectric material such as silicon oxide and/or silicon nitride. For example, the buried insulator layer 20 can include thermal silicon oxide. The thickness of the buried insulator layer 20 can be from 5 nm to 1000 nm, and typically from 100 nm to 200 nm, although lesser and greater thicknesses can also be employed. The buried insulator layer 20 may, or may not, include multiple dielectric layers, e.g., a stack including at least a silicon oxide layer and a silicon nitride layer.

The lower silicon layer 52L includes single crystalline silicon, and contacts a top surface of the buried insulator layer 20. The thickness of the lower silicon layer 52L can be from 1 nm to 20 nm, and typically from 2 nm to 10 nm, although lesser and greater thicknesses can also be employed. The lower silicon layer 52L can be provided as a doped single crystalline silicon layer having a doping of a first conductivity type or as an intrinsic (i.e., undoped) single crystalline silicon layer. The first conductivity type can be p-type or n-type. If the lower silicon layer 52L is a doped single crystalline silicon layer, the dopant concentration in the lower silicon layer 52L can be from $1.0 \times 10^{17}/cm^3$ to $3.0 \times 10^{19}/cm^3$, although lesser and greater dopant concentrations can also be employed. If the lower silicon layer 52L is an intrinsic single crystalline silicon layer, the lower silicon layer 52L may be, but does not need to be, doped with dopants of the first conductivity type immediately after the substrate 8 as illustrated in FIG. 1 is provided, or at a subsequent processing step, by performing an ion implantation employing a conventional ion implantation processing step or by performing a plasma doping.

Figure 2:
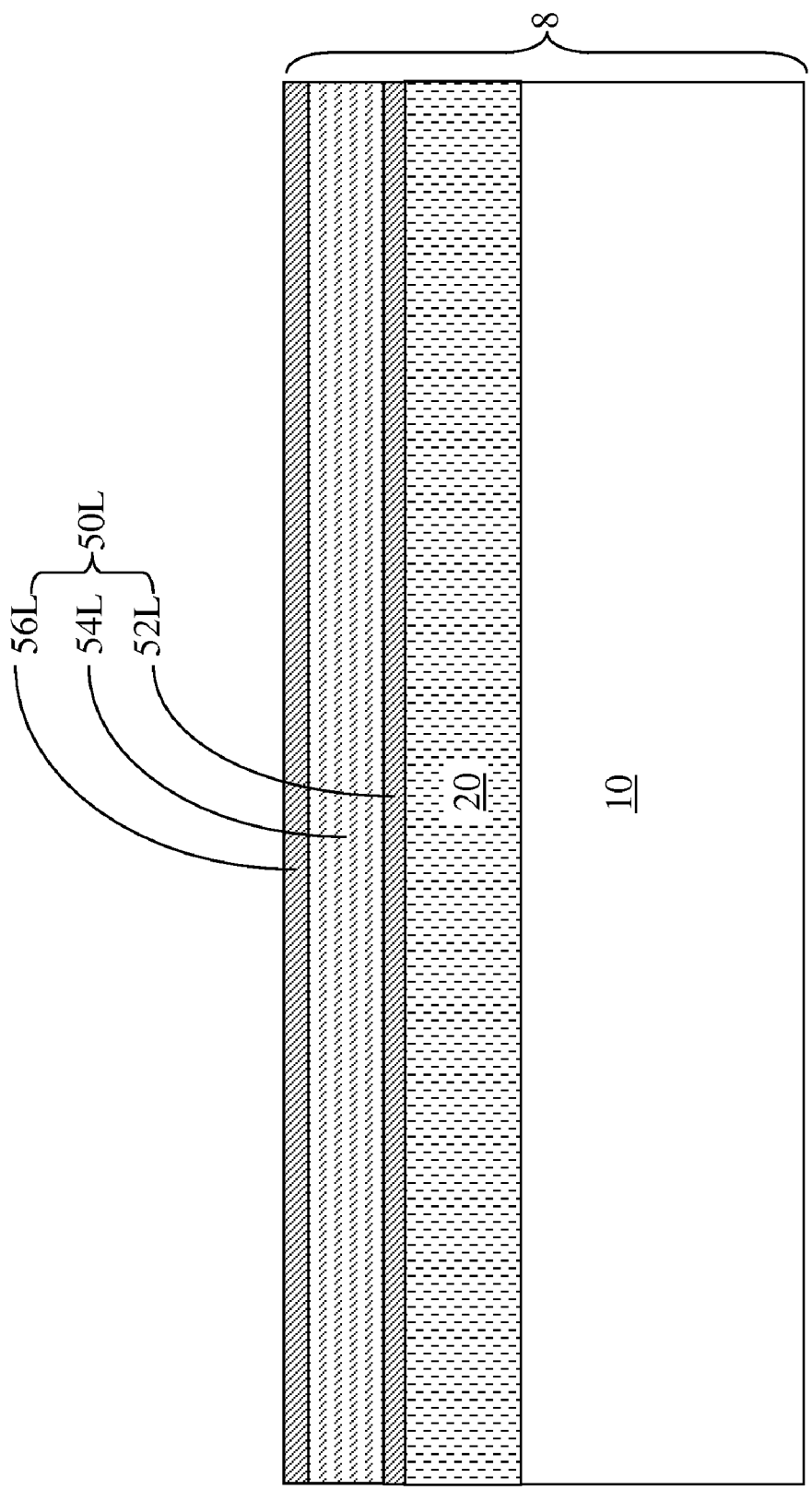
FIG. 2 is a vertical cross-sectional view of the first exemplary semiconductor structure of FIG. 1 after formation of a silicon-germanium alloy layer and an upper silicon layer.

Referring to FIG. 2, at least one additional semiconductor layer is epitaxially deposited on the lower silicon layer 52L. The at least one semiconductor layer includes a silicon-germanium alloy layer 54L. For example, the at least one semiconductor layer can include a stack, from bottom to top, of the silicon-germanium alloy layer 54L and an upper silicon layer 56L. The stack of the lower silicon layer 52L, the silicon-germanium alloy layer 54L, and the upper silicon layer 56L is a semiconductor material stack, and is herein collectively referred to as a semiconductor material structure 50L. The entirety of the semiconductor material structure 50L is epitaxial throughout, i.e., single crystalline throughout the entirety thereof The silicon-germanium alloy layer 54L includes a single crystalline silicon-germanium alloy. The silicon-germanium alloy layer 54L contacts a top surface of the lower silicon layer 52L. The thickness of the silicon-germanium alloy layer 54L can be from 5 nm to 200 nm, and typically from 10 nm to 100 nm, although lesser and greater thicknesses can also be employed. The silicon-germanium alloy layer 54L can be provided as a doped single crystalline silicon germanium alloy layer having a doping of the first conductivity type or as an intrinsic single crystalline silicon-germanium alloy layer. If the silicon-germanium alloy layer 54L is a doped single crystalline silicon-germanium alloy layer, the dopant concentration in the silicon-germanium alloy layer 54L can be from $1.0 \times 10^{17}/cm^3$ to $3.0 \times 10^{19}/cm^3$, although lesser and greater dopant concentrations can also be employed. If the silicon-germanium alloy layer 54L is an intrinsic single crystalline silicon-germanium alloy layer, the silicon-germanium alloy layer 54L is doped with dopants of the first conductivity type immediately after deposition of an intrinsic silicon-germanium alloy material or at a subsequent processing step by performing an ion implantation employing a conventional ion implantation processing step or by performing a plasma doping.

In one case, the atomic concentration of germanium in the silicon-germanium alloy layer 54L can be a constant number between 2% and 50%, and typically from 5% to 30%. Alternately, the atomic concentration of germanium in the silicon-germanium alloy layer 54L can be graded vertically. For example, the atomic concentration of germanium in the silicon-germanium alloy layer 54L can gradually increase with distance from the interface between the lower silicon layer 52L and the silicon-germanium alloy layer 54L, reach a peak that may, or may not, include a plateau, and then decrease with distance from the interface between the lower silicon layer 52L once the distance increases beyond the peak and/or the plateau. If the atomic concentration of germanium in the silicon-germanium alloy layer 54L, the atomic concentration of germanium in the silicon-germanium alloy layer 54L can range from 0% to 90%, and preferably from 0% to 60%. The thickness and the germanium atomic concentration profile, whether the germanium atomic concentration profile is constant or graded, are selected such that the entirety of the semiconductor material structure 50L remains single crystalline, and defect density caused by strain relaxation is at a negligible level, i.e., is not significant enough to adversely impact charge carrier mobility in the semiconductor material structure 50L, and especially in the silicon-germanium alloy layer 54L.

The upper silicon layer 56L includes single crystalline silicon, and contacts a top surface of the silicon-germanium alloy layer 54L. The thickness of the upper silicon layer 56L can be from 1 nm to 20 nm, and typically from 2 nm to 10 nm, although lesser and greater thicknesses can also be employed. The upper silicon layer 56L can be provided as a doped single crystalline silicon layer having a doping of the first conductivity type or as an intrinsic single crystalline silicon layer. If the upper silicon layer 56L is a doped single crystalline silicon layer, the dopant concentration in the upper silicon layer 56L can be from $1.0 \times 10^{17}/cm^3$ to $3.0 \times 10^{19}/cm^3$, although lesser and greater dopant concentrations can also be employed. If the upper silicon layer 56L is an intrinsic single crystalline silicon layer, the upper silicon layer 56L is doped with dopants of the first conductivity type immediately after deposition of the upper silicon layer 56L by performing an ion implantation employing a conventional ion implantation processing step or by performing a plasma doping.

In one case, if any one of the lower silicon layer 52L, the silicon-germanium alloy layer 54L, and the upper silicon layer 56L includes an intrinsic semiconductor material at the end of epitaxial deposition of the upper silicon layer 56L, dopants of the first conductivity type can be implanted so that the entirety of the semiconductor material structure 50L has a doping of the first conductivity type.

Figure 3:
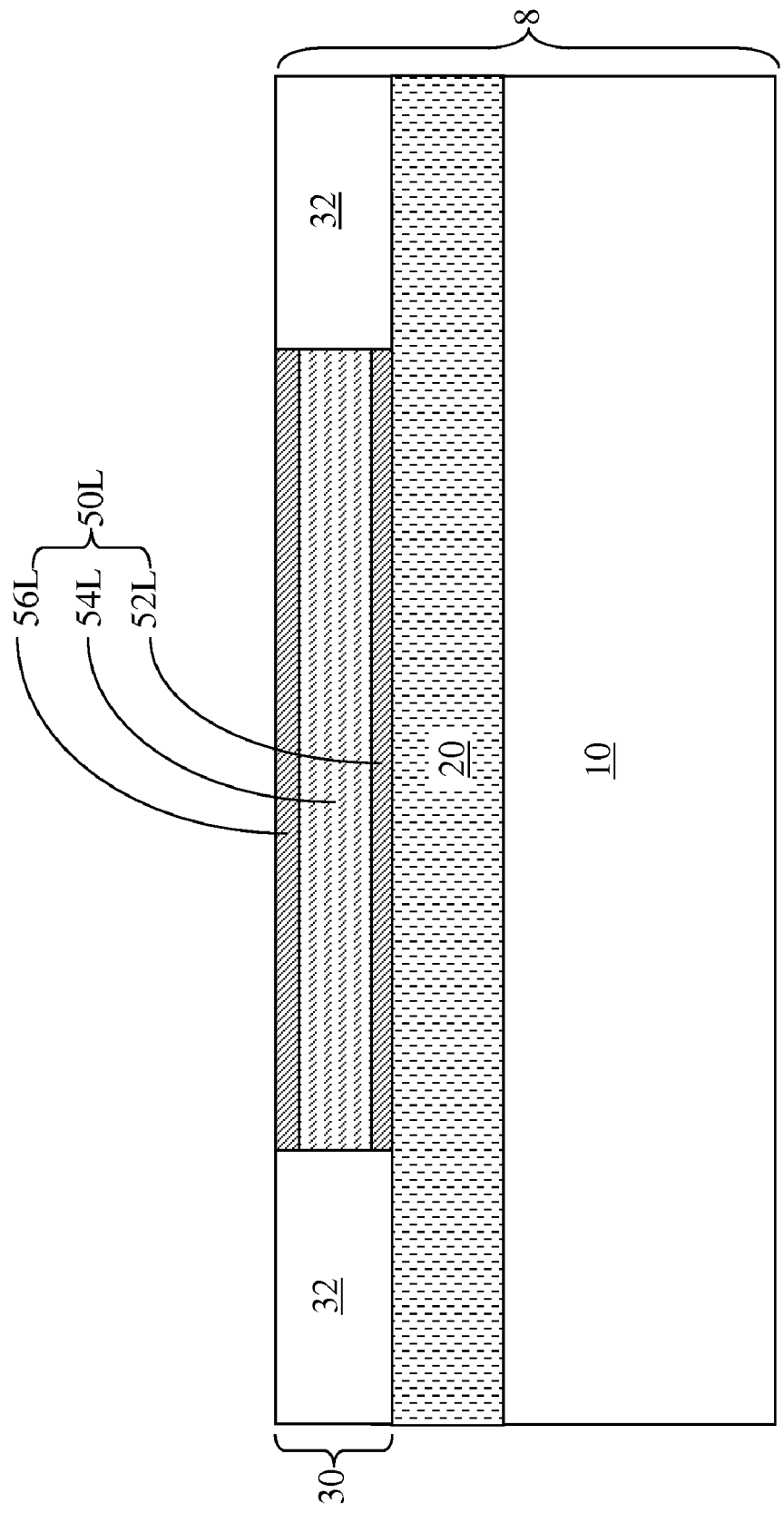
FIG. 3 is a vertical cross-sectional view of the first exemplary semiconductor structure of FIG. 2 after formation of a shallow trench isolation structure.

Referring to FIG. 3, a shallow trench isolation structure 32 is formed around a portion of the semiconductor material structure 50L, for example, by patterning a shallow trench surrounding the portion of the semiconductor material structure 50L and filling the shallow trench with a dielectric material such as silicon oxide and/or silicon nitride. The shallow trench can be formed, for example, by applying and lithographically patterning a photoresist (not shown), and transferring the pattern in the photoresist through the semiconductor material structure 50L to expose a top surfaces of the buried insulator layer 20. After removal of the photoresist, the dielectric material is deposited and subsequently planarized to form the shallow trench isolation structure 32, which laterally surrounds and contacts the remaining portion of the semiconductor material structure 50L. The top surface of the shallow trench isolation structure 32 can be coplanar with a top surface of the semiconductor material structure 50L. The semiconductor material structure 50L and the shallow trench isolation structure 32 complementarily fill a top semiconductor layer 30, which includes all materials between the plane of the bottommost surface of the semiconductor material structure 50L and the plane of the topmost surface of the semiconductor material structure 50L.

Figure 4:
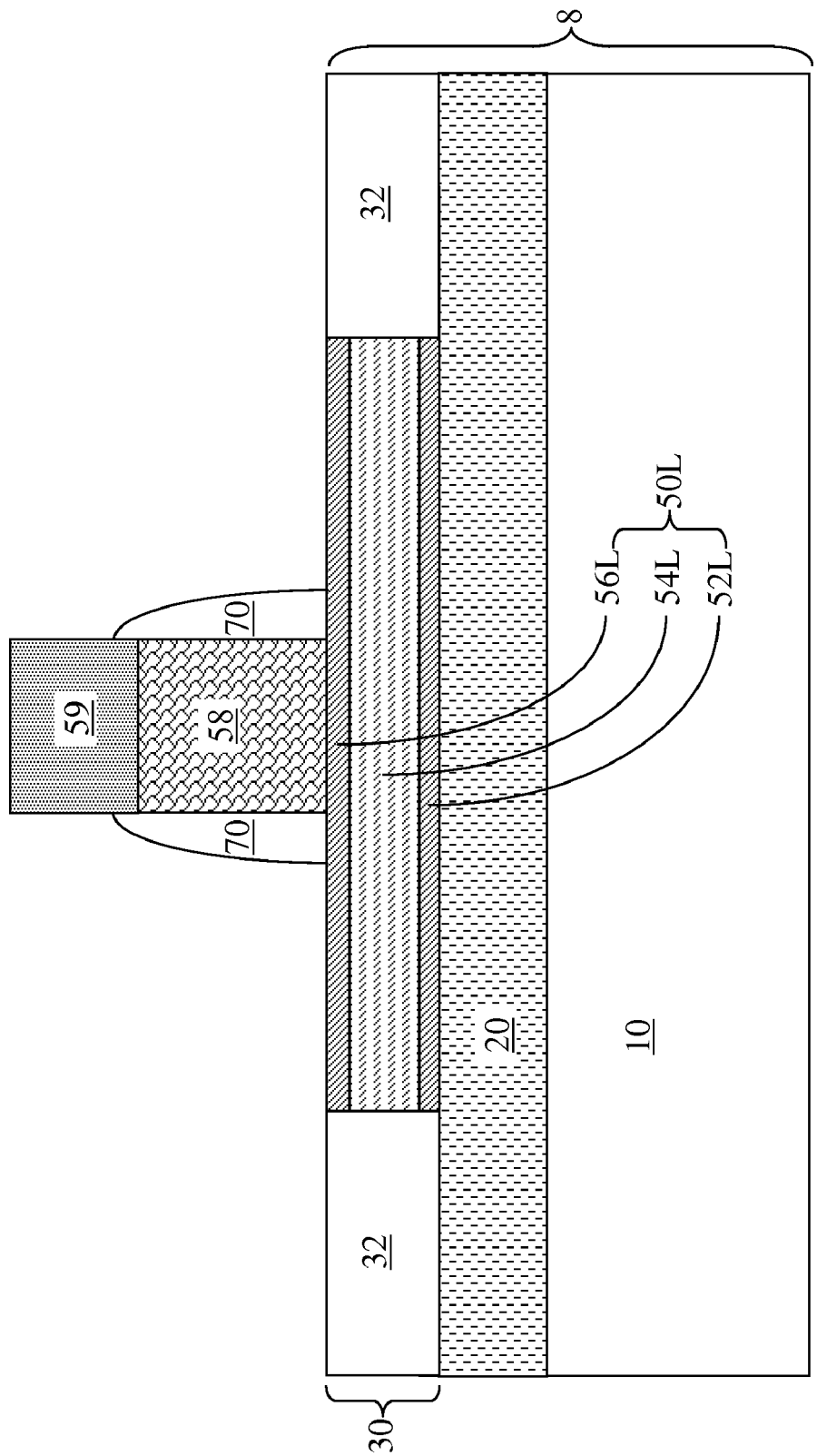
FIG. 4 is a vertical cross-sectional view of the first exemplary semiconductor structure of FIG. 3 after formation of an extrinsic base, a dielectric base cap, and a dielectric spacer.

Referring to FIG. 4, a doped semiconductor material layer and a dielectric material layer are sequentially deposited over the top surface of the top semiconductor layer 30 and lithographically patterned to form a stack, from bottom to top, of an extrinsic base, 58 and a dielectric base cap 59. The doped semiconductor material layer includes a semiconductor material having a doping of the first conductivity type. The semiconductor material of the doped semiconductor material layer, and consequently, the semiconductor material of the extrinsic base 58 derived therefrom, can be any doped semiconductor material having a doping of the first conductivity type. For example, the extrinsic base 58 can include doped silicon, a doped silicon-germanium alloy, or any other type of semiconductor material provided that the semiconductor material of the extrinsic base 58 is doped with dopants of the first conductivity type.

The extrinsic base 58 can include a doped polycrystalline semiconductor material or a doped epitaxial semiconductor material that is epitaxially aligned to the semiconductor material structure 50L. If the extrinsic base 58 includes a doped polycrystalline semiconductor material, the extrinsic base 58 can include doped polysilicon, a doped polycrystalline silicon-germanium alloy, or any other type of polycrystalline semiconductor material. If the extrinsic base 58 includes a doped epitaxial semiconductor material, the extrinsic base 58 can include doped epitaxial (single-crystalline) silicon or a doped epitaxial silicon-containing alloy such as a silicon-germanium alloy, a silicon-carbon alloy, or a silicon-germanium-carbon alloy.

The doped semiconductor material layer can be deposited, for example, by chemical vapor deposition (CVD). In one embodiment, the doped semiconductor material layer can be deposited with in-situ doping that incorporates dopants of the first conductivity type during deposition. In another embodiment, the doped semiconductor material layer can be deposited as an intrinsic semiconductor material and subsequently implanted with dopants of the first conductivity type. The dopant concentration in the extrinsic base 58 can be from $1.0\times10^{18}/cm^3$ to $1.0\times10^{21}/cm^3$, although lesser and greater dopant concentrations can also be employed. Typically, the extrinsic base 58 has a higher dopant concentration than the semiconductor material structure 50L, and specifically, than any one of the lower silicon layer 52L, the silicon-germanium alloy layer 54L, and the upper silicon layer 56L. The thickness of the extrinsic base 58 can be from 50 nm to 300 nm, although lesser and greater thicknesses can also be employed.

The dielectric material layer includes a dielectric material such as silicon oxide and/or silicon nitride. The dielectric material layer can be deposited, for example, by chemical vapor deposition such as low temperature chemical vapor deposition (LPCVD) or plasma enhanced chemical vapor deposition (PECVD). The thickness of the dielectric base cap 59, which is substantially equal to the thickness of the dielectric material layer from which the dielectric base cap 59 is derived, can be from 10 nm to 200 nm, although lesser and greater thicknesses can also be employed. If the dielectric material layer includes a different material from the shallow trench isolation region 32, the dielectric base cap 59 can be subsequently removed selective to the shallow trench isolation region 32. For example, the shallow trench isolation region 32 can include silicon oxide, and the dielectric base cap 59 can include silicon nitride.

The stack of the extrinsic base 58 and the dielectric base cap 59 can be formed by lithographically patterning the stack of the doped semiconductor material layer and the dielectric material layer, for example, by applying and lithographic patterning of a photoresist and by subsequently transferring the pattern in the photoresist into the stack of the doped semiconductor material layer and the dielectric material layer by an anisotropic etch that employs the photoresist as an etch mask. The etch can be endpointed so that the etch terminates (with a predetermined overetch) upon detection of exposed surfaces of the shallow trench isolation structure 32. The photoresist is subsequently removed.

The thickness of the dielectric base cap 59 depends on how an emitter and a collector are subsequently formed. If an emitter and a collector are to be subsequently formed with in-situ doping, the dielectric base cap 59 can be thinner than the semiconductor material structure 50L. If an emitter and a collector are to be subsequently formed by deposition of intrinsic silicon and ion implantation, the dielectric base cap 59 is thicker than the semiconductor material structure 50L. In one case, the entirety of the semiconductor material structure 50L can be single crystalline, and the extrinsic base 58 can be polycrystalline.

The stack of the extrinsic base 58 and the dielectric base cap 59 straddles over a middle portion of the semiconductor material structure 50L so that two end portions of the stack of the extrinsic base 58 and the dielectric base cap 59 overlie the shallow trench isolation region. One portion of semiconductor material structure 50L is exposed on one side of the stack of the extrinsic base 58 and the dielectric base cap 59, and another portion of the semiconductor material structure 50L is exposed on the opposite side of the stack of the extrinsic base 58 and the dielectric base cap 59.

A dielectric spacer 70 is formed, for example, by depositing another dielectric material layer and anisotropically etching that dielectric material layer. The dielectric spacer 70 can include a different dielectric material than the dielectric material of the dielectric base cap 59. For example, the dielectric spacer 70 can include silicon oxide, and the dielectric base cap 59 can include silicon nitride. The dielectric spacer 70 laterally surrounds, and contacts the sidewalls of, the stack of the extrinsic base 58 and the dielectric base cap 59.

Because the top surface of the semiconductor material structure 50L is planar, the entirety of an interface between the semiconductor material structure 50L and the extrinsic base 58 is located in a single horizontal plane. In some cases, the entirety of the bottom surface of the dielectric spacer 70 can be located in the same horizontal plane, i.e., the single horizontal plane including the interface between the semiconductor material structure 50L and the extrinsic base 58.

Figure 5:
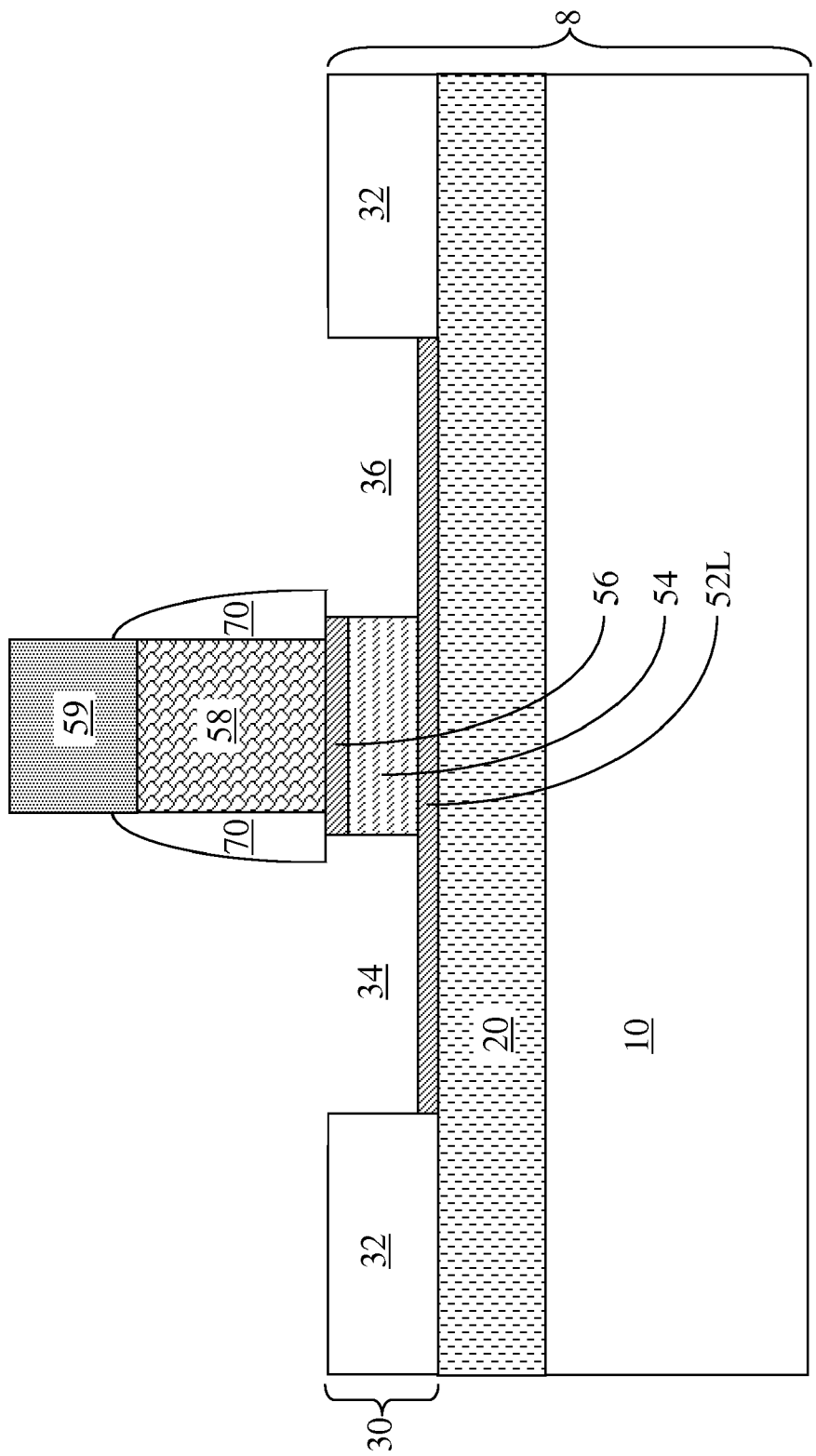
FIG. 5 is a vertical cross-sectional view of the first exemplary semiconductor structure of FIG. 4 after formation of a first trench and a second trench on both sides of the extrinsic base.

Referring to FIG. 5, a first trench 34 and a second trench 36 are formed on both sides of the assembly of the extrinsic base 58, the dielectric base cap 59, and the dielectric spacer 70, for example, by an anisotropic etch that removes exposed portions of the upper silicon layer 56L and the silicon-germanium alloy layer 54L. The first trench 34 is formed by removing a first portion of the semiconductor material stack 50L from one side of the extrinsic base 58, and the second trench 36 is formed by removing a second portion of the semiconductor material stack 50L from an opposite side of the extrinsic base 58. The anisotropic etch can stop on the lower silicon layer 52L, for example, by monitoring the composition of the etch residue (by detecting the decrease in the percentage of germanium in the etch residue), by selecting an etch chemistry that etches a silicon-germanium alloy with selectivity to silicon, or by employing a timed etch that stops before all of the exposed portions of the lower silicon layer 52L is etched. At the end of the anisotropic etch, at least a portion the lower silicon layer 52L is contiguously present at the bottom surfaces of the first trench 34 and the second trench 36.

The first trench 34 and the second trench 36 are formed with an undercut below the bottom surface of the dielectric spacer 70, for example, by introducing an isotropic etch component during or after the anisotropic etch so that the anisotropic etch includes a non-zero lateral etch component during or after the exposed portions of the silicon layer 56L and the silicon-germanium alloy layer 54L are etched. Thus, a sidewall of the first trench 34 contacts one side of the bottom surface of the dielectric spacer 70, and a sidewall of the second trench 36 contacts the opposite side of the bottom surface of the dielectric layer 70.

Figure 6:
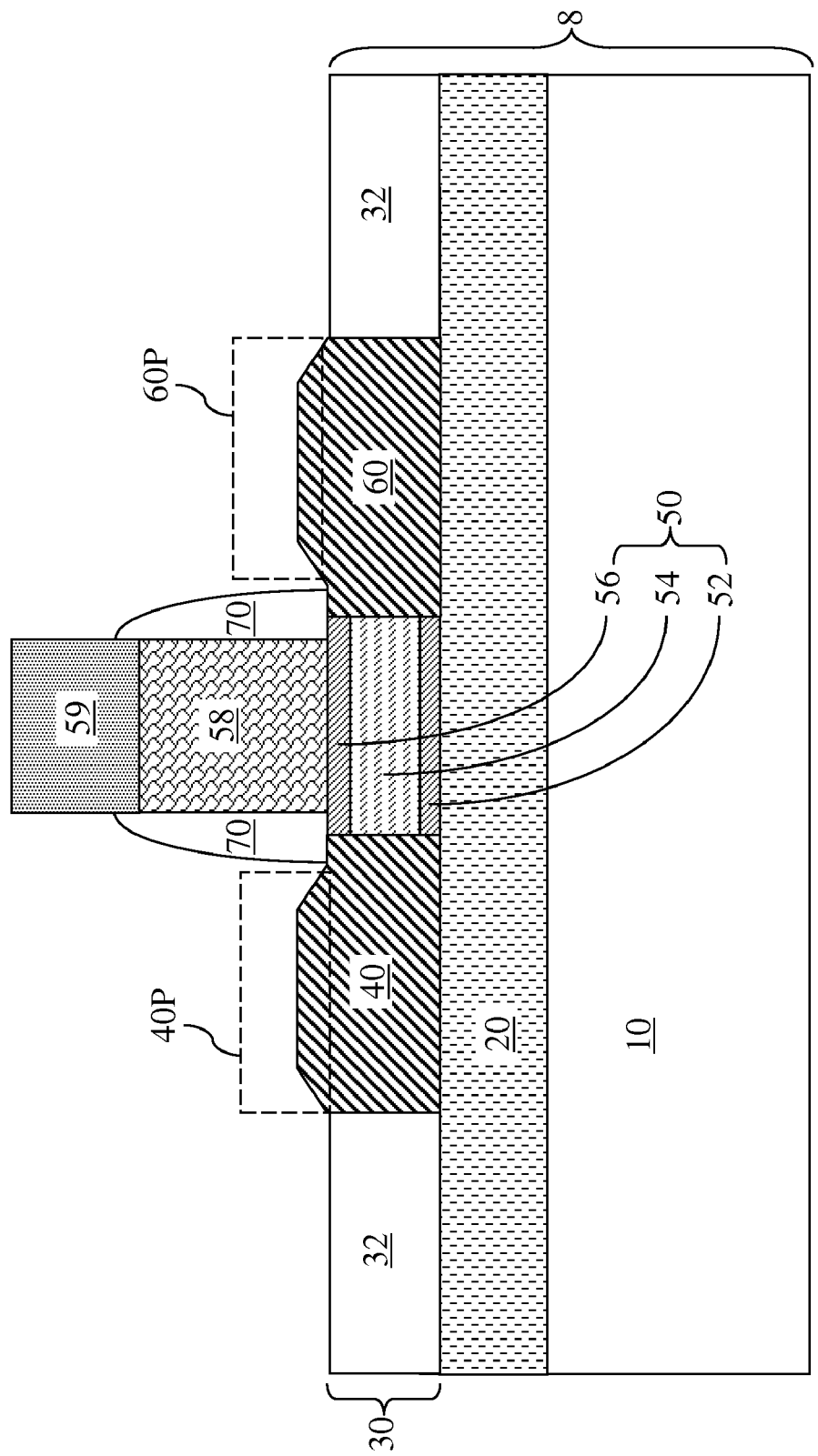
FIG. 6 is a vertical cross-sectional view of the first exemplary semiconductor structure of FIG. 4 after formation of an emitter and a collector.

Referring to FIG. 6, an emitter 40 and a collector 60 are formed by selective epitaxy in which a silicon-containing reactant is flowed into a process chamber to deposit silicon epitaxially on exposed single crystalline surfaces within the first trench 34 and the second trench 36. The selective epitaxial deposition of silicon fills the first trench 34 to form the emitter 40 therein, and fills the second trench 36 to form the collector 60 therein. The emitter 40 and the collector have a doping of a second conductivity type, which is the opposite of the first conductivity type. For example, if the first conductivity type is p-type, the second conductivity type is n-type, and vice versa. The emitter 40 includes a first doped silicon region having a doping of the second conductivity type. The collector 60 includes a second doped silicon region having a doping of the second conductivity type.

In one case, the emitter 40 and the collector 60 are doped in-situ during the selective epitaxial deposition of silicon. Formation of the emitter 40 and the collector 60 with in-situ doping can be effected by flowing a dopant gas including a dopant atom of the second conductivity type concurrently with, or alternately with, a silicon-containing reactant gas. Silicon-containing reactant gases include, but are not limited to, $SiH_4$, $SiH_2Cl_2$, $SiHCl_3$, $SiCl_4$, and $Si_2H_6$. If the second conductivity type is n-type, the dopant gas can be, for example, $PH_3$, $AsH_3$, $SbH_3$, or a combination thereof. If the second conductivity type is p-type, the dopant gas can be, for example, $B_2H_6$. Because the thickness of the lower silicon layer 52L is sufficiently small, e.g., less than 20 nm and typically less than 10 nm, dopants of the second conductivity type diffuse downward to the bottommost surfaces of the portion of the lower silicon layer 52L during the selective epitaxial growth, which is performed at an elevated temperature greater than 500° C., and typically at a temperature greater than 800° C. Thus, the portions of the lower silicon layer 52L underlying the doped silicon deposited by the selective epitaxy are incorporated into the emitter 40, i.e., constitute a bottommost portion of the emitter 40 or a bottommost portion of the collector 60.

In another case, the emitter 40 and the collector 60 are deposited as intrinsic silicon portions by selective epitaxy of intrinsic silicon, and are subsequently doped by implanting dopants of the second conductivity type. In this case, the thickness of the dielectric base cap 59 is selected to be thicker than the distance between the bottom surface of the extrinsic base 58 and the top surface of the buried insulator layer 20. Because the thickness of the lower silicon layer 52L is sufficiently small, e.g., less than 20 nm and typically less than 10 nm, dopants of the second conductivity type can be implanted into the portions of the lower silicon layer 52L underlying the epitaxially deposited silicon material portions that fill the first trench 34 and the second trench 36. Thus, the portions of the lower silicon layer 52L underlying the doped silicon deposited by the selective epitaxy are incorporated into the emitter 40, i.e., constitute a bottommost portion of the emitter 40 or a bottommost portion of the collector 60. The lateral straggle of implanted dopants cause the interfaces between the base 50 and each of the emitter 40 and the collector 60 to be laterally offset from the vertical plane extending from the bottommost portions of the dielectric spacer 70.

The remaining portion of the semiconductor material structure 50L after formation of the emitter 40 and the collector 60 constitutes a base 50. The base 50 includes a silicon-germanium alloy base region 54 having a doping of the first conductivity type, an upper silicon base region 56 having a doping of the first conductivity type, and a lower silicon base region 52 having a doping of the first conductivity type. The lower silicon base region 52 can be derived from a lower silicon layer 52L having a doping of the first conductivity type, or can be derived from a lower silicon layer 52L that is intrinsic as originally provided, but is doped with dopants of the first conductivity type by vertical diffusion of dopants of the first conductivity type from the silicon-germanium alloy layer 54L during thermal cycling of the first exemplary semiconductor structure, which is provided, for example, during the selective epitaxy of silicon that fills the first and second trenches (34, 36).

The upper silicon base region 56 contacts the top surface of the silicon-germanium alloy base region 54, the emitter 40, the collector 60, and a bottom surface of the extrinsic base 58. The lower silicon base region 52 contacts a bottom surface of the silicon-germanium alloy base region 54, the emitter 40, the collector 60, and the buried insulator layer 20. A first lateral heterojunction is present at a first interface between the first doped silicon region, i.e., the emitter 40, and the base 50 that includes the silicon-germanium alloy region 54, the lower silicon base region 52, and the upper silicon base region

56. A second lateral heterojunction is present at a second interface between the second doped silicon region, i.e., the collector 60, and the base 50.

A first portion of the bottom surface of the dielectric spacer 70 contacts an upper end of the first lateral heterojunction between the emitter 40 and the base 50, and a second portion of the bottom surface of the dielectric spacer 70 contacts an upper end of a second lateral heterojunction between the collector 60 and the base 50. The extrinsic base 58 contacts a top surface of the base 50, and includes a semiconductor material having a doping of the first conductivity type. The base 50, the emitter 40, and the collector 60 contact the top surface of a buried insulator layer 20 of the substrate 8, which can be a semiconductor-on-insulator (SOI) substrate. The shallow trench isolation structure 32 laterally surrounds and contacts the emitter 40, the base 50, and the collector 60.

The entirety of an interface between the based 50 and the extrinsic base 58 can be located in a single horizontal plane, which can be the same plane in which the entirety of the bottom surface of the dielectric spacer 70 is located. A protruding portion 40P of the emitter 40 and a protruding portion 60P of the collector 60 can be present above a plane of the interface between the base 50 and the extrinsic base 58. Because the emitter 40 and the collector 60 are formed by epitaxy, crystallographic facets can be present on the exposed surfaces of the emitter 40 and the collector 60. A first plurality of crystallographic facets having different crystallographic orientations can be present on the protruding portion 40P of the emitter 40, and a second plurality of crystallographic facets having different crystallographic orientations is present on the protruding portion 60P of the collector 60.

Figure 7:
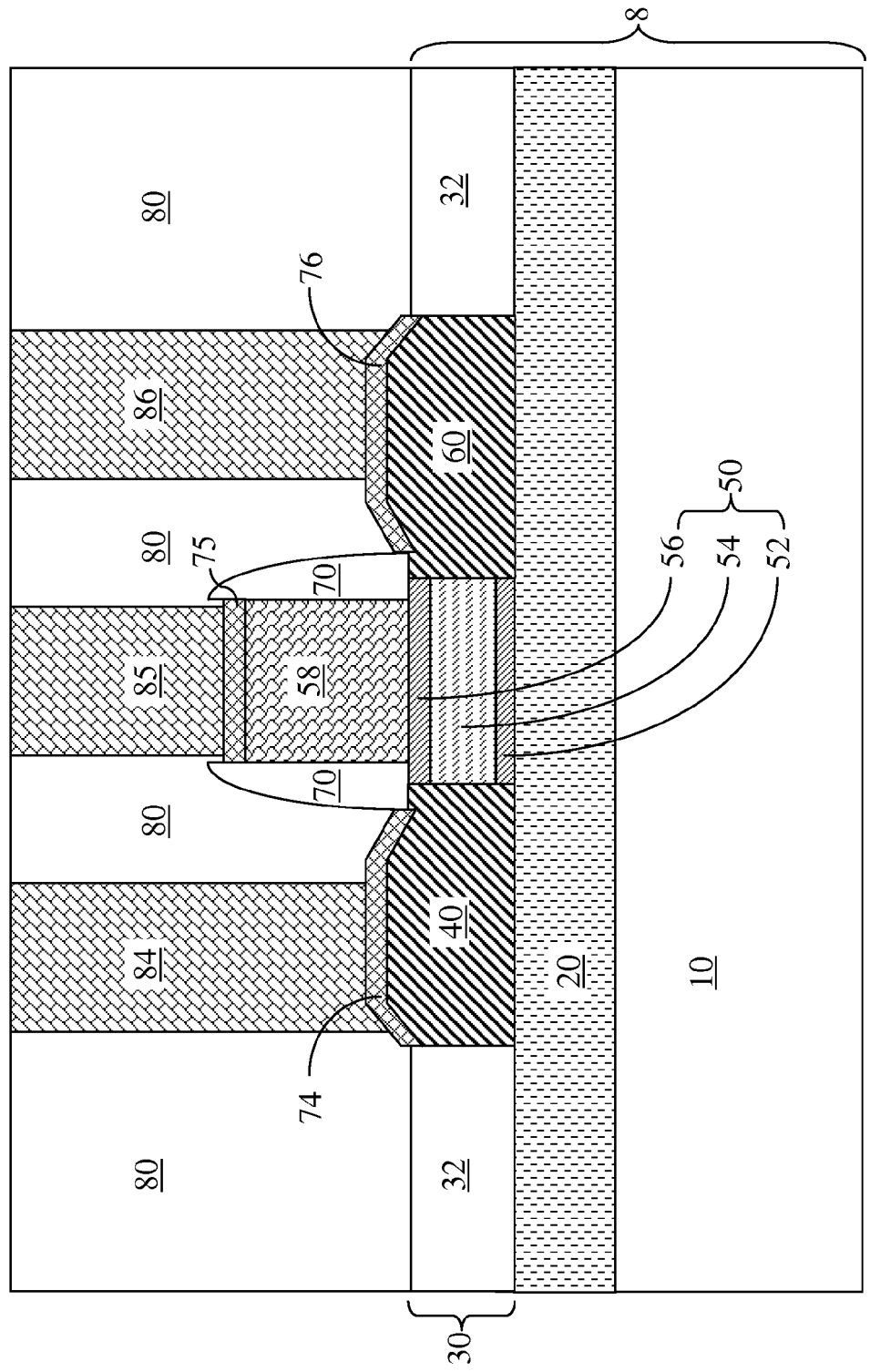
FIG. 7 is a vertical cross-sectional view of the first exemplary semiconductor structure of FIG. 4 after formation of metal semiconductor alloy regions and contact via structures.

Referring to FIG. 7, the dielectric base cap 59 is removed selective to the dielectric spacer 70, the shallow trench isolation structure 32, the emitter 40, the collector 60, and the extrinsic base 58. For example, if the dielectric base cap 59 includes silicon nitride and the dielectric spacer 70 and the shallow trench isolation structure 32 includes silicon oxide, the dielectric base cap 59 can be removed by a wet etch employing hot phosphoric acid.

Various metal semiconductor alloy regions may be optionally formed. If metal semiconductor alloy regions are formed, the metal semiconductor alloy regions can include an emitter metal silicide region 74, a collector metal silicide region 76, and an extrinsic base metal semiconductor alloy region 75. Because each of the emitter metal silicide region 74 and the collector metal silicide region 76 has substantially the same thickness, the surfaces of the emitter 40 and the collector 60 can include a plurality of crystallographic facets. A protruding portion of the emitter 40 and a protruding portion of the collector 60 can be present above the plane of the interface between the base 50 and the extrinsic base 58.

A contact-level dielectric material layer 80 can be deposited and various contact via structures can be formed to provide electrical contact to the emitter 40, the base 50 (through the extrinsic base 58), and the collector 60. The contact-level dielectric material layer 80 can include undoped silicate glass (i.e., silicon oxide), doped silicate glass, organosilicate glass, or any other dielectric material known in the art that can be employed for forming interconnect structures. The various contact via structures can include an emitter-side contact via structure 84, a base-side contact via structure 85, and a collector-side contact via structure 86.

Figure 8:
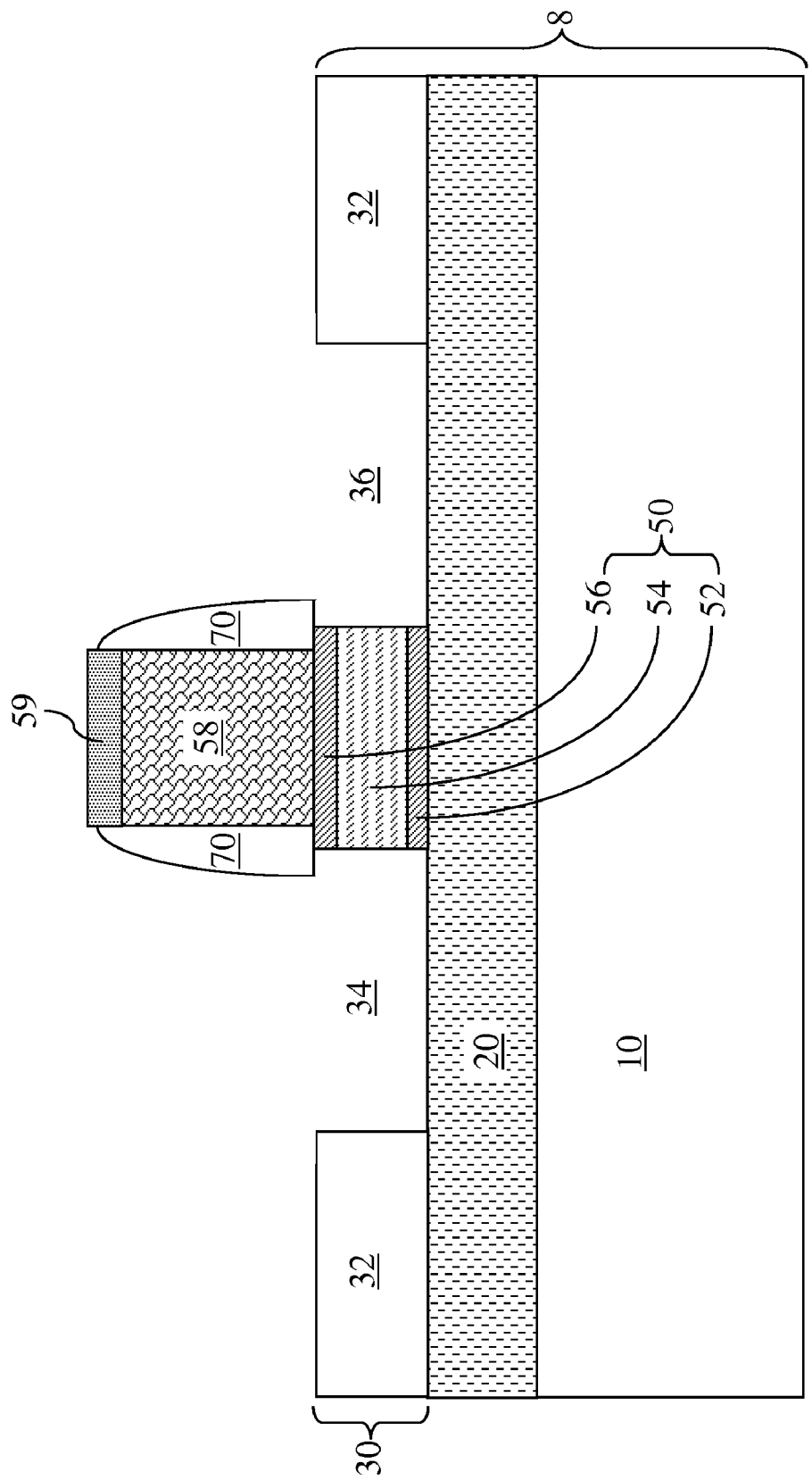
FIG. 8 is a vertical cross-sectional view of a variation of the first exemplary semiconductor structure of FIG. 7 after formation of a first trench and a second trench.

Referring to FIG. 8, a variation of the first exemplary semiconductor structure is derived from the first exemplary semiconductor structure of FIG. 5 by extending the anisotropic etch that forms the first trench 34 and the second trench 36 until exposed portions of the lower silicon layer 52L so that portions of the top surface of the buried insulator layer 20 are exposed at the bottom of the first and second trenches (34, 36).

Upon formation of the first and second trenches (34, 36), the remaining portion of the semiconductor material structure 50L constitutes a base 50, which includes a silicon-germanium alloy base region 54 having a doping of the first conductivity type, an upper silicon base region 56 having a doping of the first conductivity type, and a lower silicon base region 52 having a doping of the first conductivity type.

Figure 9:
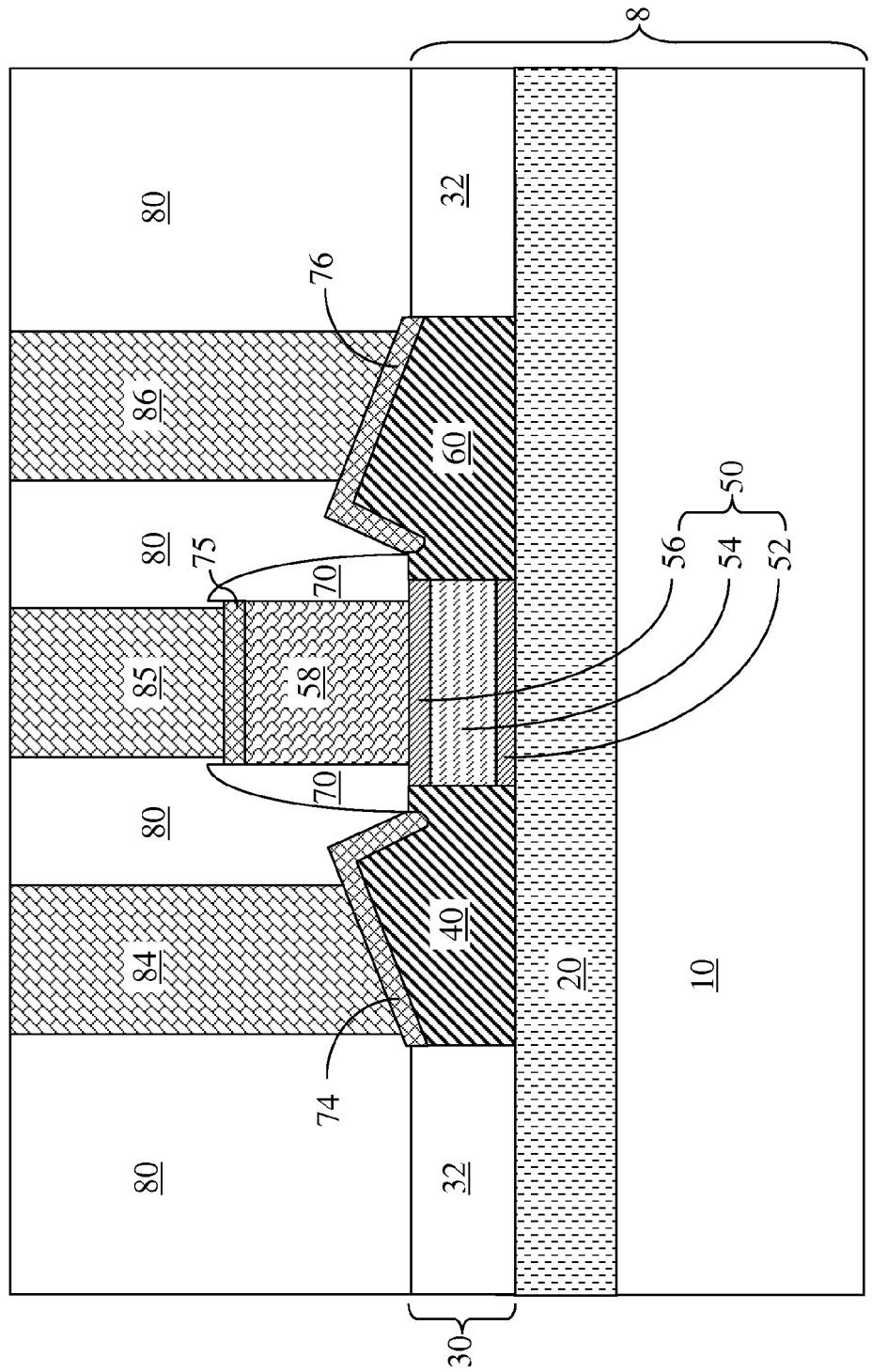
FIG. 9 is a vertical cross-sectional view of the variation of the first exemplary semiconductor structure of FIG. 8 after formation of an emitter, a collector, metal semiconductor alloy regions, and contact via structures.

Referring to FIG. 9, the processing steps of FIGS. 6 and 7 are performed to form a lateral heterojunction bipolar transistor having the same components as the lateral heterojunction bipolar transistor shown in FIG. 7 except for potential differences in the shapes of the emitter 40, the collector 60, the emitter metal silicide region 74, and the collector metal silicide region 76. The differences in the shapes of the emitter 40, the collector 60, the emitter metal silicide region 74, and the collector metal silicide region 76 can be cause by the selective epitaxial growth of the emitter 40 and the collector 60 only from the sidewalls of the base 50 during the selective epitaxial growth of the emitter 40 and the collector 60. At a facet of the emitter 40 located farthest from the first heterojunction between the emitter 40 and the base 50, the height of the emitter 40 decreases with a lateral distance from the first heterojunction. Likewise, at a facet of the collector 60 located farthest from the second heterojunction between the collector 60 and the base 50, the height of the collector 60 decreases with a lateral distance from the second heterojunction.

Figure 10:
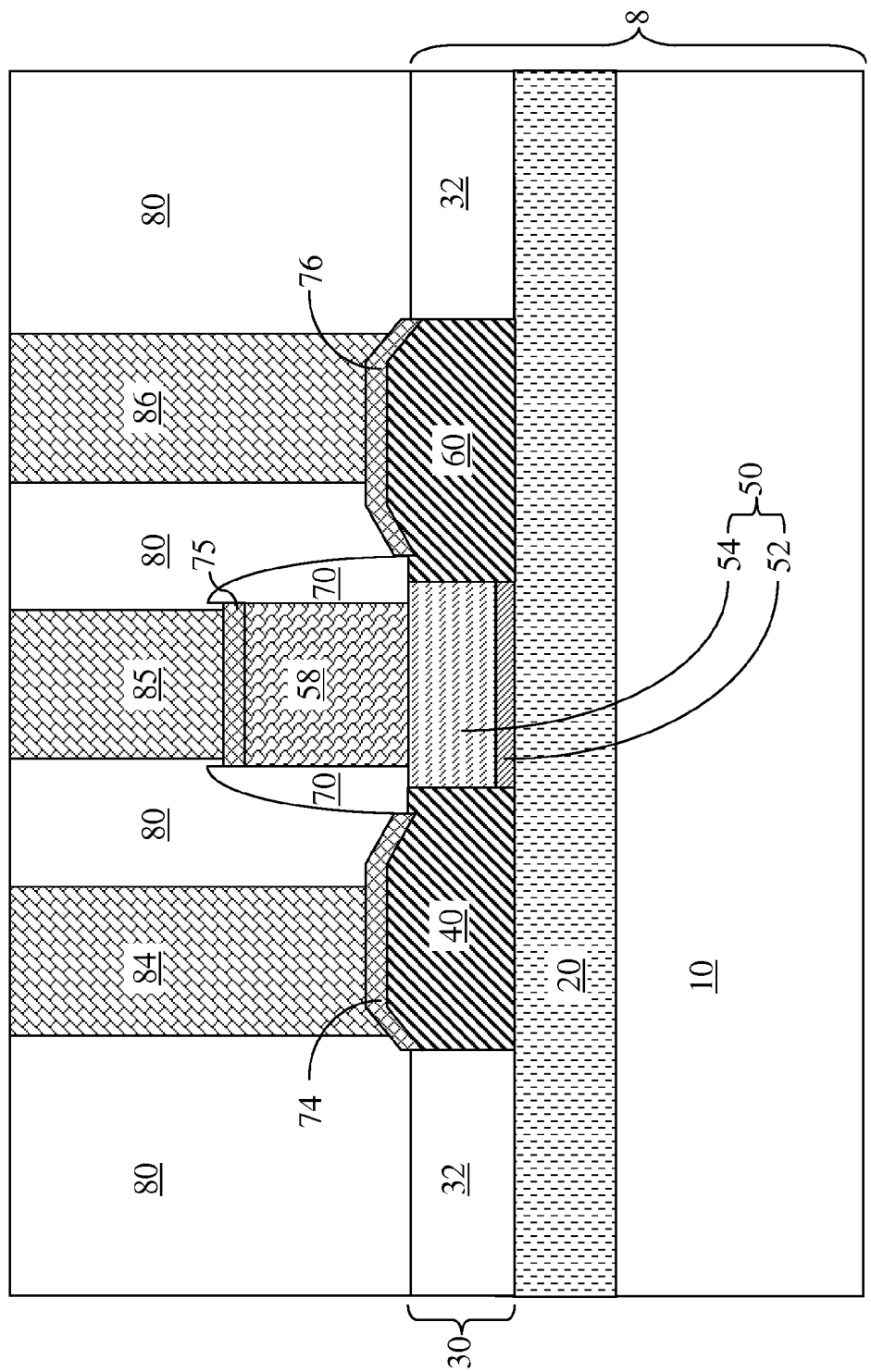
FIG. 10 is a vertical cross-sectional view of a second exemplary semiconductors structure according to a second embodiment of the present disclosure.

Referring to FIG. 10, a second exemplary semiconductors structure according to a second embodiment of the present disclosure can be derived from the first exemplary semiconductor structure shown in FIG. 7 by omitting the formation of the upper silicon layer 56L at a processing step corresponding to FIG. 2. As a consequence, an upper silicon base region is not formed in the second exemplary semiconductor structure, and the base 50 includes only a lower silicon base region 52 and a silicon-germanium base region 54. The silicon-germanium base region 54 contacts the bottom surfaces of the extrinsic base 58 and the dielectric spacer 70.

Figure 11:
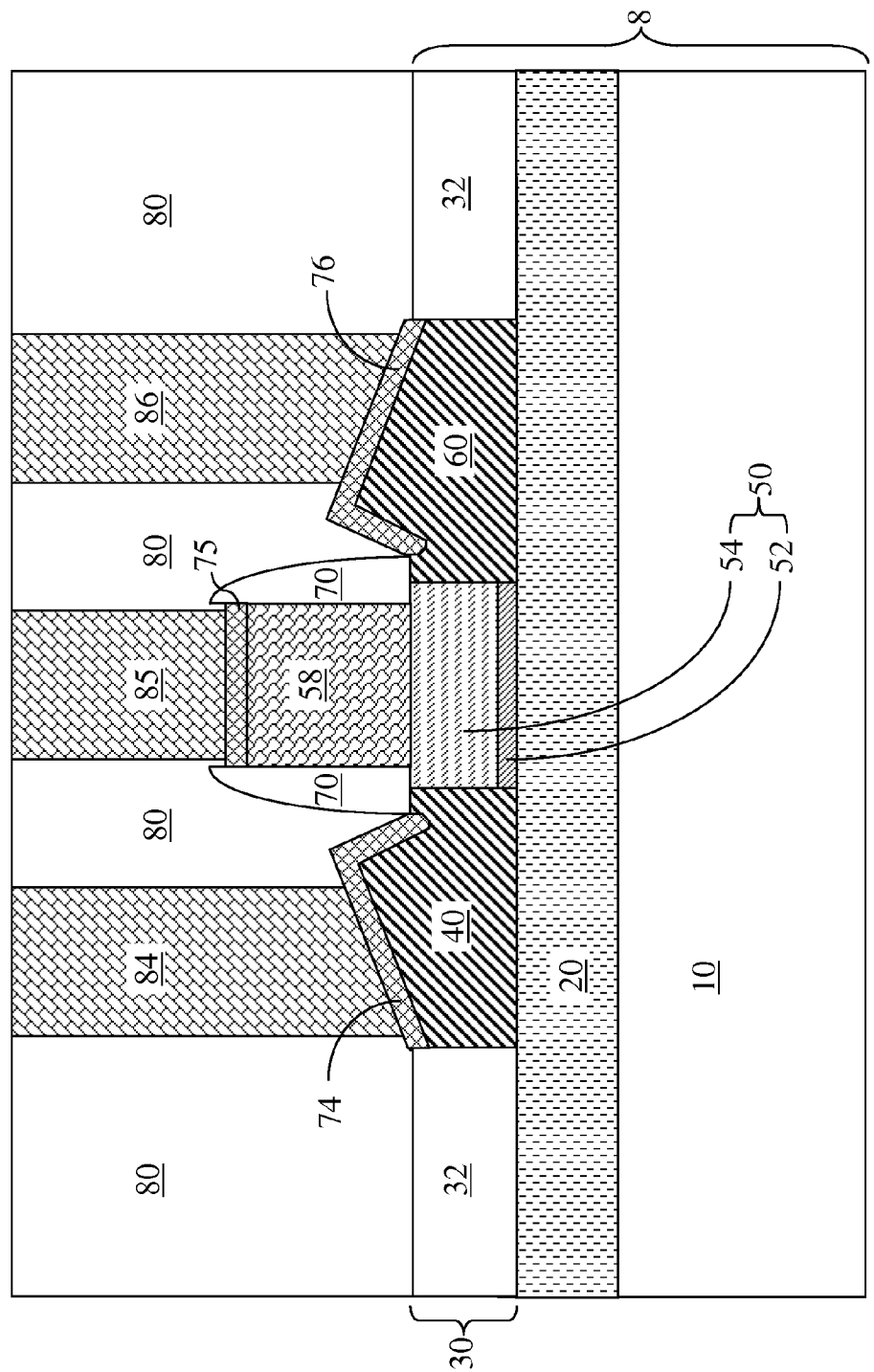
FIG. 11 is a vertical cross-sectional view of a variation of the second exemplary semiconductor structure.

Referring to FIG. 11, a variation of the second exemplary semiconductors structure can be derived from the variation of the first exemplary semiconductor structure as shown in FIG. 9 by omitting the formation of the upper silicon layer 56L at a processing step corresponding to FIG. 2. As a consequence, an upper silicon base region is not formed in the variation of the second exemplary semiconductor structure, and the base 50 includes only a lower silicon base region 52 and a silicon-germanium base region 54. The silicon-germanium base region 54 contacts the bottom surfaces of the extrinsic base 58 and the dielectric spacer 70.

Figure 12:
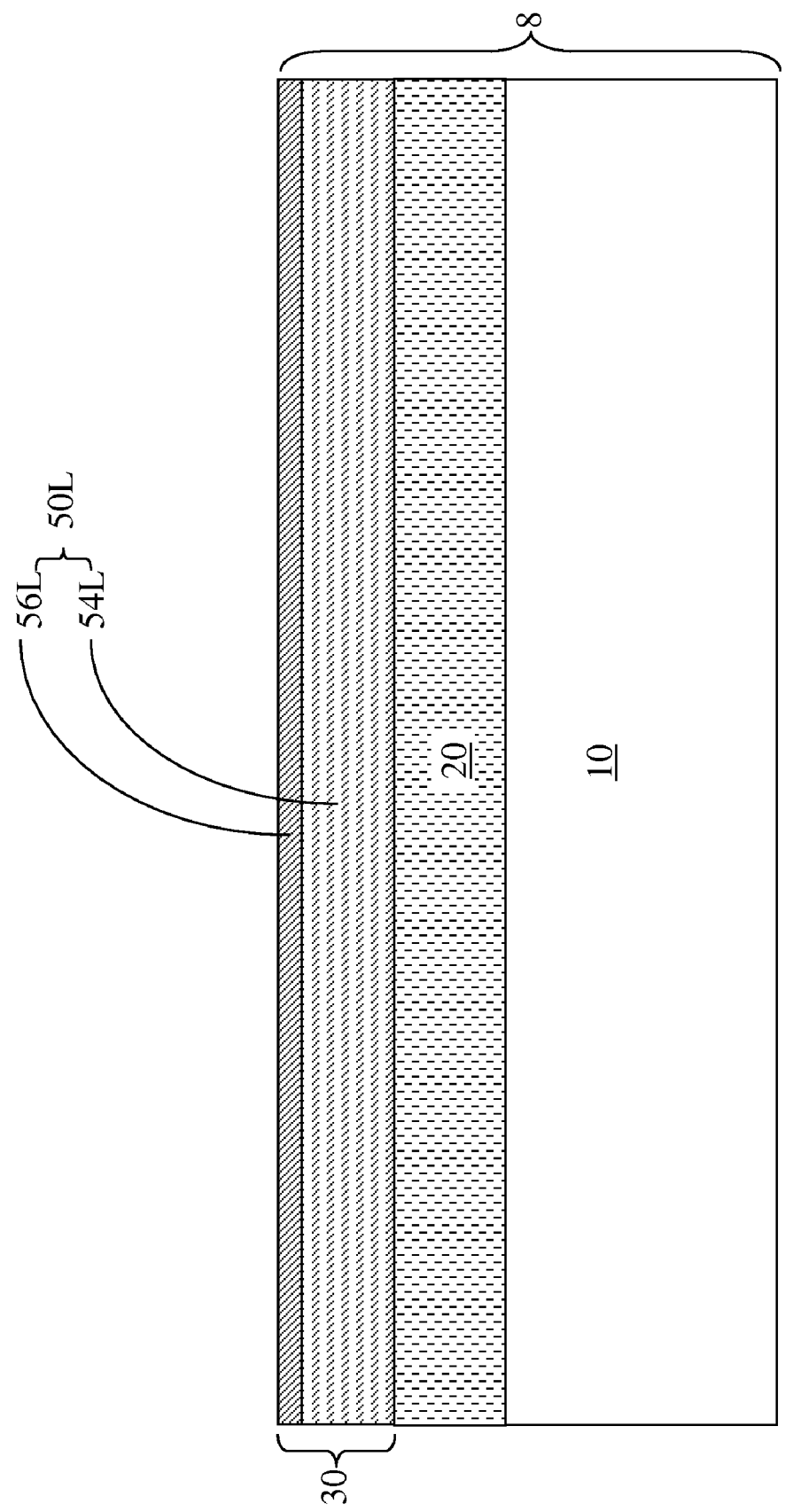
FIG. 12 is a vertical cross-sectional view of a third exemplary semiconductor structure after formation of an upper silicon layer according to a third embodiment of the present disclosure.

Referring to FIG. 12, a third exemplary semiconductor structure after formation of an upper silicon layer according to a third embodiment of the present disclosure can be formed by providing a silicon-germanium-on-insulator (SGOI) substrate, which is a type of semiconductor-on-insulator substrate. The SGOI substrate includes a stack, from bottom to top, of a handle substrate 10, a buried insulator layer 20 contacting a top surface of the handle substrate 10, and a silicon-germanium alloy layer 54L that contacts a top surface of the buried insulator layer 20. The handle substrate 10 and the buried insulator layer 20 can be the same as in the first and second embodiments.

The silicon-germanium alloy layer 54L can be a single crystalline silicon-germanium layer having the same compositional characteristics and thickness as in the first and second embodiments, except that the silicon-germanium alloy layer 54L contacts the buried insulator layer 20. The silicon-germanium alloy layer 54L can be provided having a full thickness, or can be provided with a thickness less than the full thickness and an additional silicon-germanium alloy material can be epitaxially deposited to increase the thickness of the silicon-germanium alloy layer 54L. Subsequently, an upper silicon layer 56L can be deposited in the same manner as in the first embodiment.

The same processing steps are performed as in the first embodiment. During the formation of the first trench 34 and the second trench 36 corresponding to the processing step of FIG. 5 or FIG. 7, the top surface of the buried insulator is exposed because a lower silicon layer is not present in the third exemplary semiconductor structure. Accordingly, at a processing step corresponding to FIG. 9, the deposition of the emitter 40 and the collector 60 proceeds as in the variation of the first exemplary semiconductor structure, i.e., the epitaxial growth of the emitter 40 and the collector 60 proceeds from the sidewalls of the base 50, which includes a silicon-germanium base region 54 and an upper silicon base region 56.

Figure 13:
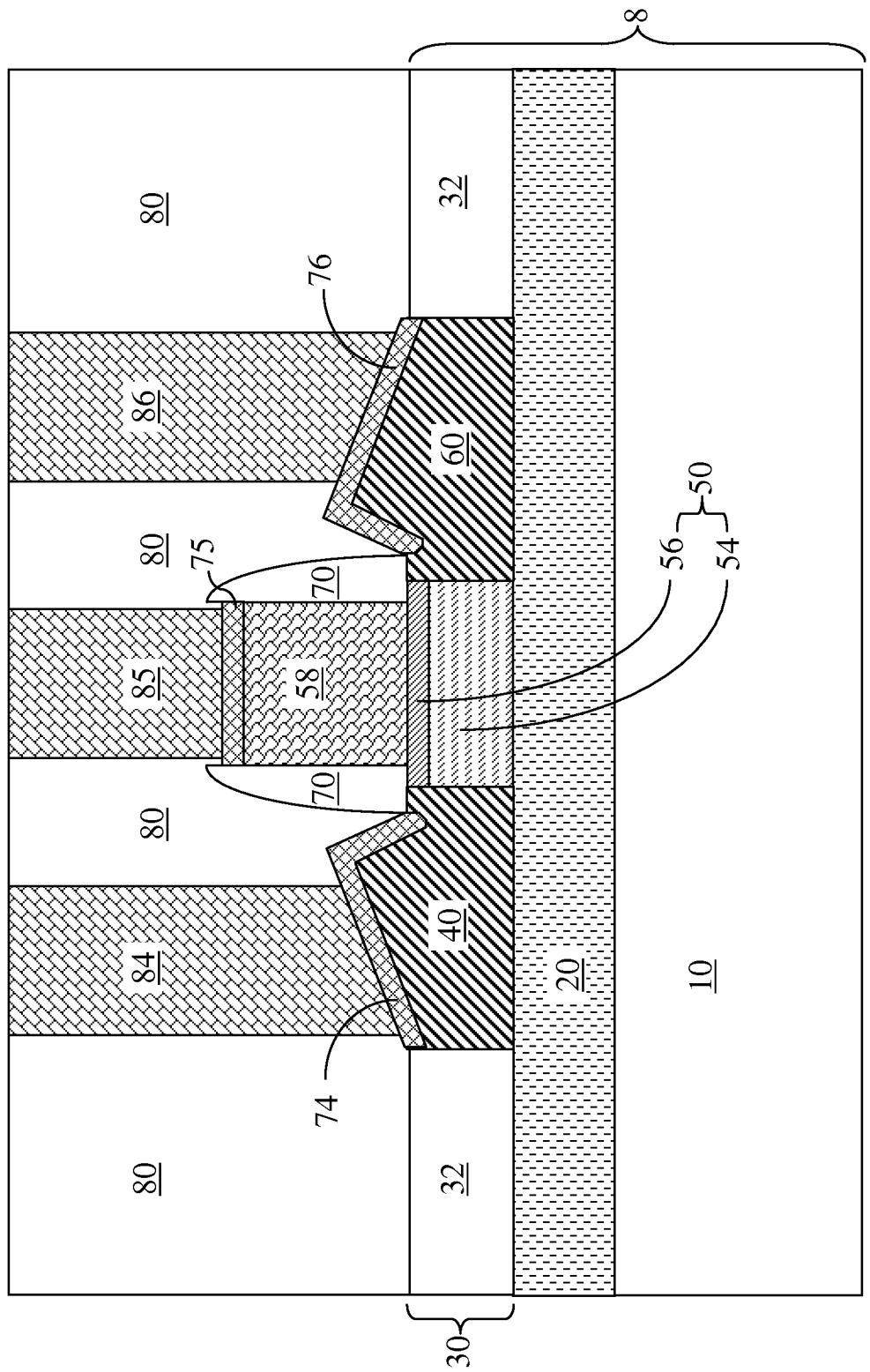
FIG. 13 is a vertical cross-sectional view of the third exemplary semiconductor structure of FIG. 12 after formation of an extrinsic base, an emitter, a collector, metal semiconductor alloy regions, and contact via structures.

Referring to FIG. 13, the processing steps of FIG. 7 are performed to form optional metal semiconductor alloy regions (74, 75, 76) and various contact via structures (84, 85, 86). In the third exemplary semiconductor structure, the base 50 includes the silicon-germanium base region 54 and the upper silicon base region 56. The silicon-germanium base region 54 has a doping of the first conductivity type, and contacts a top surface of the buried insulator layer 20, the emitter 40, the collector 60, and a bottom surface of the upper silicon base region 56. The upper silicon base region 56 has a doping of the first conductivity type, and contacts a top surface of the silicon-germanium alloy base region 54, the emitter 40, the collector 60, and the bottom surface of the extrinsic base 58. A first heterojunction is formed between the emitter 40 and the base 50, and a second heterojunction is formed between the base 50 and the collector.

Figure 14:
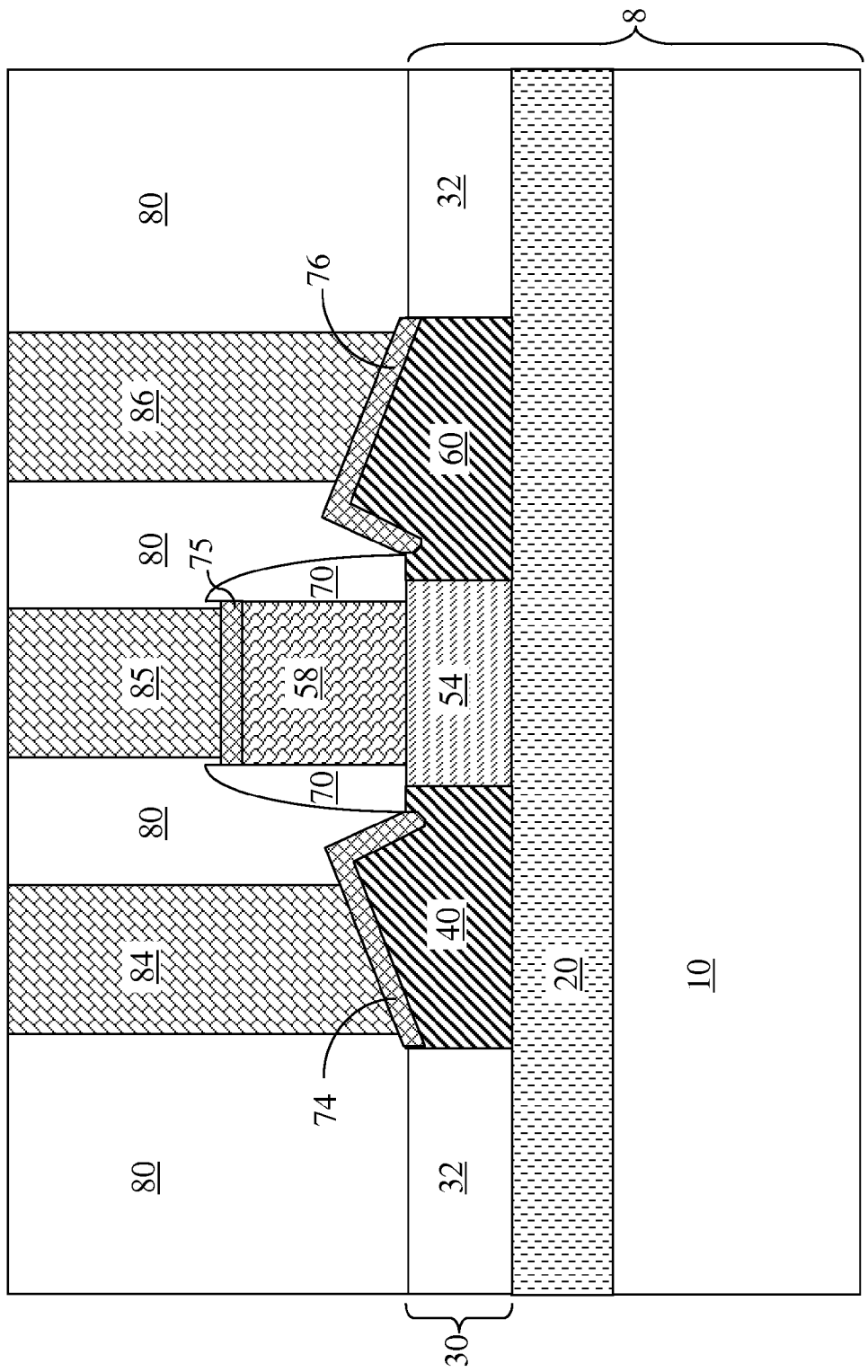
FIG. 14 is a vertical cross-sectional view of a fourth exemplary semiconductor structure according to a fourth embodiment of the present disclosure.

Referring to FIG. 14, a fourth exemplary semiconductor structure according to a fourth embodiment of the present disclosure is derived from the third exemplary semiconductor structure of FIG. 13 by omitting formation of the upper silicon layer 56L. In the fourth exemplary semiconductor structure, the base 50 consists of the silicon-germanium base region 54. The silicon-germanium base region 54 has a doping of the first conductivity type, and contacts a top surface of the buried insulator layer 20, the emitter 40, the collector 60, and a bottom surface of the extrinsic base 58. A first heterojunction is formed between the emitter 40 and the base 50, and a second heterojunction is formed between the base 50 and the collector.

In each of the exemplary semiconductor structures illustrated above, the collector current flows primarily in and through a silicon-germanium alloy region, i.e., the silicon-germanium base region 54, which has a smaller band gap than silicon regions, i.e., the upper silicon base region 56, the lower silicon base region 52, the emitter 40, and the base 60. For example, if the atomic concentration of germanium is 20% in the silicon-germanium base region 54, the band gap of the silicon-germanium base region 54 is smaller than the band gap of silicon regions by about 200 meV. Thus, the collector current density through the silicon-germanium base region 54 of the base 50 can be more than 2000 times the collector current density in the upper silicon base region 56 or in the lower silicon base region 52.

With the collector current flows mostly confined in the silicon-germanium base region 54, the path of the collector current can be located away from the interface between a semiconductor material, i.e., the lower silicon base region 52, and a dielectric material, i.e., the buried insulator layer 20, in the first and second embodiments. This configuration reduces noise in the signal by avoiding charge capture and emission at the interface between the lower silicon base region 52 and the buried insulator layer 20.

Further, because the collector current flows mostly confined in the silicon-germanium base region 54, the path of the collector current can be located away from a heavily doped base contact, i.e., away from the interface between the upper silicon base region 56 and the extrinsic base region 58 in the first and third embodiments. This configuration reduces noise in the signal by avoiding charge capture and emission at the interface between the upper silicon base region 56 and the extrinsic base region 58.

In addition, parasitic capacitance is minimized because the side of the first heterojunction between the emitter 40 and the base 50 is substantially the same as the second heterojunction between the base 50 and the collector 60.

Each of the exemplary semiconductor devices can be formed as a lateral pnp heterojunction bipolar transistor or as an npn heterojunction bipolar transistor.

While the present disclosure has been described in terms of specific embodiments, it is evident in view of the foregoing description that numerous alternatives, modifications and variations will be apparent to those skilled in the art. Accordingly, the present disclosure is intended to encompass all such alternatives, modifications and variations which fall within the scope and spirit of the present disclosure and the following claims.

What is claimed is:

1. A semiconductor structure comprising:
    a base including at least a silicon-germanium alloy base region having a doping of a first conductivity type;
    an emitter including a first doped silicon region having a doping of a second conductivity type that is the opposite of said first conductivity type, wherein a first lateral heterojunction is present at a first interface between said first doped silicon region and said silicon-germanium alloy region;
    a collector including a second doped silicon region having a doping of said second conductivity type, wherein a second lateral heterojunction is present at a second interface between said second doped silicon region and said silicon-germanium alloy region; and
    an extrinsic base contacting a top surface of said base and including a semiconductor material having a doping of said first conductivity type.

2. The semiconductor structure of claim 1, wherein said base, said emitter, and said collector contact a top surface of a buried insulator layer of a semiconductor-on-insulator (SOI) substrate.

3. The semiconductor structure of claim 1, further comprising a dielectric spacer laterally surrounding said extrinsic base, wherein a first portion of a bottom surface of said dielectric spacer contacts an upper end of said first lateral heterojunction, and a second portion of said bottom surface of said dielectric spacer contacts an upper end of said second lateral heterojunction.

4. The semiconductor structure of claim 3, wherein an entirety of an interface between said base and said extrinsic base is located in a single horizontal plane.

5. The semiconductor structure of claim 4, wherein an entirety of said bottom surface of said dielectric spacer is located in said single horizontal plane.

6. The semiconductor structure of claim 1, wherein a protruding portion of said emitter and a protruding portion of said collector are present above a plane of an interface between said base and said extrinsic base.

7. The semiconductor structure of claim 6, wherein a first plurality of crystallographic facets having different crystallographic orientations is present on said protruding portion of said emitter, and a second plurality of crystallographic facets having different crystallographic orientations is present on said protruding portion of said collector.

8. The semiconductor structure of claim 1, further comprising a shallow trench isolation structure laterally surrounding and contacting said emitter, said base, and said collector.

9. The semiconductor structure of claim 1, wherein an entirety of said base is single crystalline, and said extrinsic base is polycrystalline.

10. The semiconductor structure of claim 1, wherein said base further includes a lower silicon base region having a doping of said first conductivity type, contacting a bottom surface of said silicon-germanium alloy base region, said emitter, said collector, and a buried insulator layer of a semiconductor-on-insulator substrate.

11. The semiconductor structure of claim 1, wherein said base further includes an upper silicon base region having a doping of said first conductivity type, contacting a top surface of said silicon-germanium alloy base region, said emitter, said collector, and a bottom surface of said extrinsic base.

12. The semiconductor structure of claim 1, wherein said base further includes:
- a lower silicon base region having a doping of said first conductivity type and contacting a bottom surface of said silicon-germanium alloy base region, said emitter, said collector, and a buried insulator layer of a semiconductor-on-insulator substrate; and
- an upper silicon base region having a doping of said first conductivity type and contacting a top surface of said silicon-germanium alloy base region, said emitter, said collector, and a bottom surface of said extrinsic base.

13. The semiconductor structure of claim 1, wherein said base consists of said silicon-germanium alloy base region.

* * * * *